United States Patent
Gagnon et al.

(10) Patent No.: US 8,406,495 B2
(45) Date of Patent: Mar. 26, 2013

(54) MR SEGMENTATION USING TRANSMISSION DATA IN HYBRID NUCLEAR/MR IMAGING

(75) Inventors: Daniel Gagnon, Twinsburg, OH (US); Zhiqiang Hu, Twinsburg, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 250 days.

(21) Appl. No.: 13/062,222

(22) PCT Filed: Sep. 9, 2009

(86) PCT No.: PCT/IB2009/053944
§ 371 (c)(1),
(2), (4) Date: Mar. 4, 2011

(87) PCT Pub. No.: WO2010/032167
PCT Pub. Date: Mar. 25, 2010

(65) Prior Publication Data
US 2011/0164801 A1 Jul. 7, 2011

Related U.S. Application Data

(60) Provisional application No. 61/097,555, filed on Sep. 17, 2008.

(51) Int. Cl.
*G06K 9/00* (2006.01)
(52) U.S. Cl. .......................................... 382/128; 378/4
(58) Field of Classification Search .................. 382/128, 382/131; 250/363.03, 363.04, 370.08, 370.09; 600/410, 411, 436; 378/4, 6, 8, 21, 23
See application file for complete search history.

(56) References Cited

U.S. PATENT DOCUMENTS

| | | | | |
|---|---|---|---|---|
| 5,376,795 A | * | 12/1994 | Hasegawa et al. | 250/363.04 |
| 5,449,913 A | | 9/1995 | Chang | |
| 5,672,877 A | * | 9/1997 | Liebig et al. | 250/363.04 |
| 6,310,968 B1 | | 10/2001 | Hawkins et al. | |
| 6,384,416 B1 | | 5/2002 | Turkington et al. | |
| 6,628,983 B1 | * | 9/2003 | Gagnon | 600/431 |
| 8,180,128 B2 | * | 5/2012 | Feiweier et al. | 382/128 |
| 2003/0014388 A1 | | 1/2003 | Shih et al. | |
| 2004/0161140 A1 | * | 8/2004 | Yuzefovich et al. | 382/131 |

(Continued)

FOREIGN PATENT DOCUMENTS
WO 2008064319 A2 5/2008

OTHER PUBLICATIONS

Kops, E. R., et al.; Alternative methods for attenuation correction for PET images in MR-PET scanners; 2008; Nuclear Science Symposium Conference Record; vol. 6; abstract.

(Continued)

*Primary Examiner* — Claire X Wang
*Assistant Examiner* — Shervin Nakhjavan (57) ABSTRACT

When correcting attenuation in a nuclear image (e.g., PET or SPECT), an MR-based attenuation correction (AC) map (16) is generated using MR image data (14) of a subject (60). The subject (60) is then placed in a nuclear imaging device with a radioactive point or line source (18, 18') from which transmission data is measured as the patient is imaged. In order to resolve ambiguity between air voxels and bone voxels in the MR-based AC map (16), estimated transmission data (24) is generated from the AC map and compared to the measured transmission data (22) from the point or line source. An error is iteratively calculated for the estimated and measured transmission data, and attenuation values of the AC map (16) are refined to minimize the error. The refined AC map (32) is used to correct attenuation in collected nuclear data (41) which is reconstructed into an attenuation corrected image (99) of the patient.

18 Claims, 5 Drawing Sheets

U.S. PATENT DOCUMENTS

| | | | |
|---|---|---|---|
| 2005/0226527 A1* | 10/2005 | Weese et al. | 382/275 |
| 2006/0004274 A1* | 1/2006 | Hawman | 600/407 |
| 2006/0237652 A1* | 10/2006 | Kimchy et al. | 250/363.02 |
| 2007/0106154 A1 | 5/2007 | Conti | |
| 2007/0131858 A1 | 6/2007 | Wollenweber et al. | |
| 2007/0221850 A1* | 9/2007 | Panin et al. | 250/363.04 |
| 2008/0135769 A1* | 6/2008 | Rosen | 250/363.09 |
| 2009/0110256 A1* | 4/2009 | Thielemans et al. | 382/131 |
| 2009/0326362 A1* | 12/2009 | Carlse et al. | 600/411 |

OTHER PUBLICATIONS

Zaidi, H., et al.; Determination of the Attenuation Map in Emission Tomography; 2003; J. Nucl. Med.; 44:291-315.

Zaidi, H., et al.; Magnetic resonance imaging-guided attentuation and scatter corrections in three-dimensional brain positron emission tomography; 2003; Med. Phys.; 30(5)937-948.

* cited by examiner

MR SEGMENTATION USING TRANSMISSION DATA IN HYBRID NUCLEAR/MR IMAGING

CROSS REFERENCE TO RELATED APPLICATIONS

This application claims the benefit of U.S. provisional application Ser. No. 61/097,555 filed Sep. 17, 2008, which is incorporated herein by reference.

The present innovation finds particular application in anatomic imaging systems, particularly involving combined PET-MR imaging, but may also find application in other nuclear imaging systems and the like. However, it will be appreciated that the described technique may also find application in other imaging systems, other imaging scenarios, other image analysis techniques, and the like.

In positron emission tomography (PET) imaging, attenuation in the PET data is typically corrected using an attenuation map. In combined PET-computed tomography (CT) imaging, the CT data can readily generate an accurate attenuation map for the PET data. CT data and images are based on radiation attenuation properties of the imaged tissues. However, in combination PET-magnetic resonance (MR) imaging, the MR images depict resonance characteristics, typically of hydration dipoles ($H^1$), which are not a function of the radiation attenuation properties of the patient.

PET scanners are usually combined with a CT scanner, or more recently with a MR scanner. The MR image can provide a map that depicts anatomical organs or segmented regions of like tissue type. For instance, the MR image usually shows bone as a dark region, which can cause problems in distinguishing bone from air, which is also shown as a dark region. Air and bone have very different radiation attenuation properties. Bone structure typically includes dense cortical bone or shell on the surface and spongy trabecular bone in the interior. A knowledge of anatomy is typically needed to distinguish between bone and air regions. Note that if the cortical shell adjoins an air pocket, the MR image would show both as a single dark region. Therefore, cortical bone may be assigned an incorrect value (e.g., a value consistent with air) in the attenuation map or vice versa. Techniques to segment the cortical bone regions exist but are not always reliable.

The present application provides new and improved systems and methods for refining an MR-based attenuation correction map for correcting attenuation in a nuclear image, which overcome the above-referenced problems and others.

In accordance with one aspect, an anatomical image correction system includes a magnetic resonance (MR) imager that acquires MR image data of a subject during an MR acquisition scan, and a nuclear scanner that acquires nuclear image data of the subject during a nuclear acquisition scan, and concurrently measures transmission data from a radiation source positioned in an examination region of the nuclear scanner. The system further includes a processor that generates an attenuation correction (AC) map from the MR image data, iteratively refines the AC map to generate a refined AC map using the measured transmission data, and corrects the nuclear image data for attenuation using the refined AC map.

In accordance with another aspect, a method of refining a magnetic resonance (MR) attenuation correction (AC) map includes generating an attenuation correction (AC) map from an MR image of a subject, transmitting radiation from a radiation source through a subject, the radiation source being deposed outside the subject, and measuring transmission data from the radiation transmitted through the subject. The method further includes generating estimated transmission data from the AC map, and generating a refined AC map by adjusting the AC map based on a comparison of the measured transmission data and the estimated transmission data.

In accordance with another aspect, a PET scanner includes a ring of radiation detectors, a radiation source stationarily mounted within the ring of radiation detectors, and a processor programmed to perform the method according to claim 1 to generate a refined attenuation correction (AC) map. The PET scanner further includes a reconstruction algorithm that corrects PET data from the radiation detectors with the refined AC map and reconstructs the corrected PET data into an attenuation-corrected PET image.

In accordance with another aspect, an apparatus for refining an attenuation correction map for correcting attenuation in a nuclear image includes means for generating an attenuation correction (AC) map from an MR image of a subject, means for transmitting radiation through a subject, the means for transmitting radiation being deposed outside the subject, and means for measuring transmission data from the radiation transmitted through the subject. The apparatus further includes means for generating estimated transmission data from the AC map, and means for generating a refined AC map by adjusting the AC map based on a comparison of the measured transmission data and the estimated transmission data.

One advantage is that attenuation correction map accuracy is improved.

Another advantage resides in resolving ambiguity between bone and air voxels in an MR-based attenuation correction map.

Still further advantages of the subject innovation will be appreciated by those of ordinary skill in the art upon reading and understand the following detailed description.

The innovation may take form in various components and arrangements of components, and in various steps and arrangements of steps. The drawings are only for purposes of illustrating various aspects and are not to be construed as limiting the invention.

Figure 1:
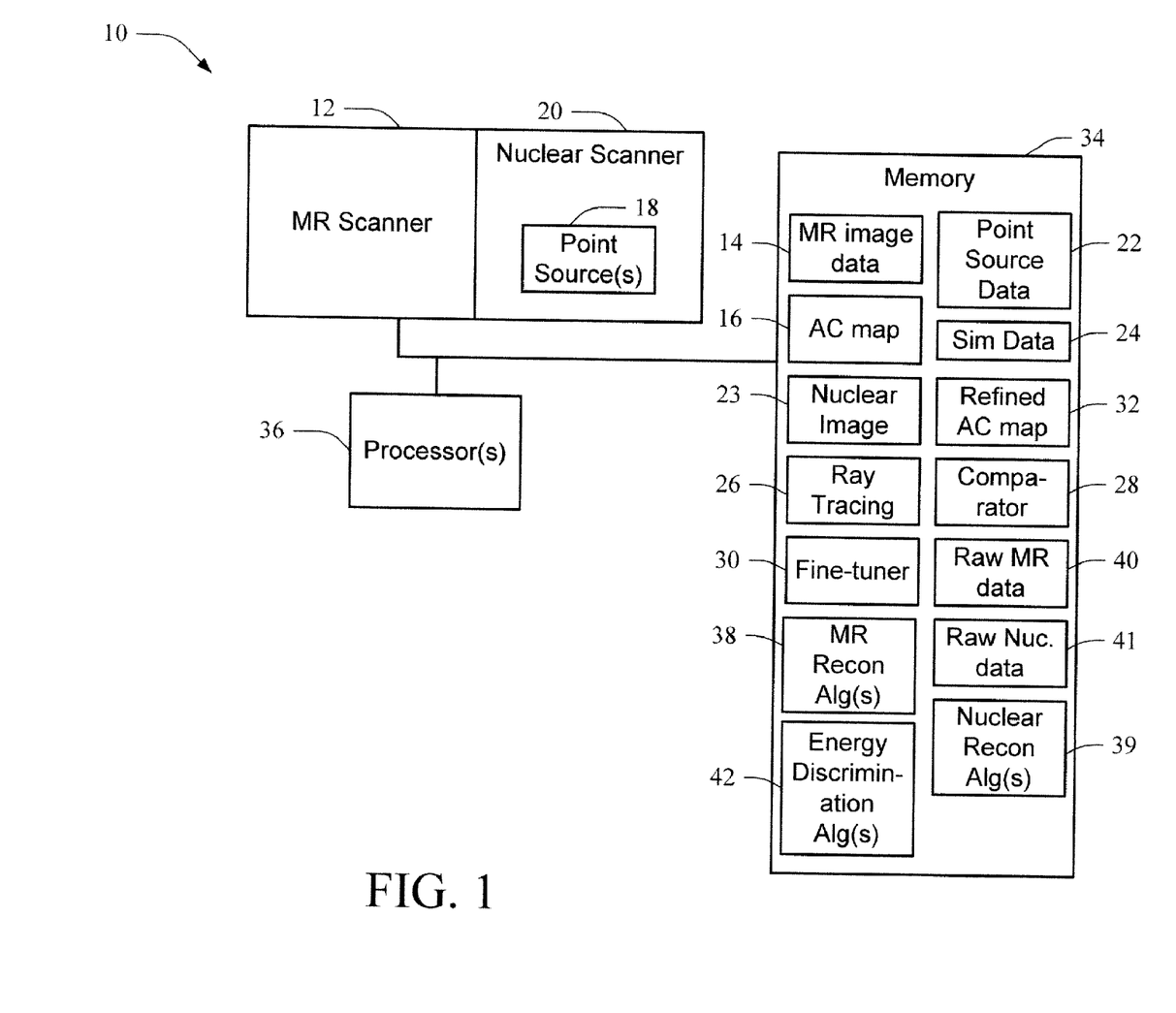
FIG. 1 illustrates a system that facilitates using a point or line source(s) for fine-tuning an MR attenuation map, in accordance with various aspects described herein.

FIG. 1 illustrates a system 10 that facilitates using a point source(s) for fine-tuning an MR attenuation map, in accordance with various aspects described herein. An MR imaging or scanning device 12 generates an MR-based image 14 of a subject's anatomy or other volume of interest, from which a body outline and outlines, lung, soft tissue, bone structure, etc., can be segmented to generate an MR attenuation correction (AC) map 16. One or multiple radiation sources 18, e.g. a point source, are placed outside the object (e.g., the volume of interest or patient) boundary, but within the examination region of a nuclear imaging device 20. Point source attenuation or transmission data 22 is measured with the nuclear imaging device 20, such as a PET scanner or a single photon emission computed tomography (SPECT) scanner. Note that attenuation and transmission are the inverse of each other in the sense that one connotes the portion of the total amount of radiation that is not absorbed (transmitted). Mathematically, either can be used. "Transmission" data will be used herein, but it is to be understood that transmission data includes both transmission and attenuation information. From a single, stationary point source a 2D projection nuclear image 23 of the object or patient can be generated. Meanwhile, estimated transmission data 24 is simulated using a ray-tracing technique or algorithm 26 projecting through the object volume using the MR attenuation map 16. The measured point source transmission data 22 and simulated transmission data 24 are compared by a comparator 28, and the difference is minimized by an iterative fine-tuning algorithm 30 that is executed on the attenuation map. The suboptimal MR attenuation map 16 thus may be optimized using measured point source transmission data to generate a refined (e.g., optimal) MR attenuation map 32.

When the MR image is segmented into different tissue types, each tissue type can be estimated and the corresponding radiation attenuation property. From the MR image and the estimated transmission value for each segment, one can calculate the estimated transmission along any ray through the subject. The estimated transmission along each ray of actually collected point source transmission is calculated. By comparing the estimated and actually measured transmission along corresponding rays, errors in the estimated transmission values can be determined. It will be noted that the multiplicity of rays pass through different segmented regions as well as through common segmented regions but with a different path length in each region. Regions estimated to be air and bone can be easily verified. Moreover, the attenuation/transmission value for each segmented region can be refined by iteratively adjusting the attenuation factors until the fit between the estimated and actually measured transmission along the rays from the point source is optimized.

Analogously, an inability to optimize the data cannot be within a preselected threshold, may indicate patient movement. Iteratively adjusting the position of the body outline and the internal regions as a whole or the positions of the internal regions within the body outline can be permitted to optimize the fit and/or detect patient movement.

It will be appreciated that the MR imaging device 12 and the nuclear imaging or scanning device 20 may be separate imaging devices or may be a combination or dual-modality imaging device, in accordance with various embodiments. For instance, the case of a dual-modality imager a subject is scanned using the MR imaging modality, and then rescanned using the nuclear imaging (e.g., PET or SPECT) modality after the point source has been positioned in the imaging device. In this manner, subject movement can be minimized between scans. Additionally, in this and other embodiments, the position of the point source may be kept constant and/or may be predetermined so that it is consistent between nuclear imaging scans in order to facilitate detection of transmission data therefrom.

The system 10 includes a memory 34 that stores the MR image data 14, the suboptimal AC map 16, the measured point source data 22, the simulated or estimated point source transmission data 24, and the refined AC map 32. The memory additionally stores the ray tracing algorithm(s) 26 used to generate the simulated transmission data 24, the comparator 28 (e.g., computer-executable instructions for comparing the simulated data to the measured point source data), and the iterative fine-tuning algorithm(s) 30 used to refine the AC map 16 when generating the refined AC map 32.

Additionally, the system 10 includes a processor 36 that analyzes data stored in the memory 34 and executes the algorithms stored in the memory to generate new data for storage in the memory 34. For instance, the processor executes one or more MR reconstruction algorithms 38 to reconstruct the MR image 14 from raw MR data 40 acquired during the MR scan of the subject. Similarly, the processor may execute one or more nuclear image reconstruction algorithms 39 to reconstruct the projection nuclear image 23 from raw nuclear scan data 41 acquired during the nuclear scan of the subject. Additionally, the processor executes the ray tracing algorithms to generate the estimated transmission data 24, executes the comparator 28 to determine a difference between the estimated data 24 and the measured point source transmission data 22, and executes the iterative fine-tuning algorithm(s) 30 to generate the refined AC map 32 from the original AC map 16. It will be appreciated that "algorithm," as used herein, may be interpreted to mean one or more computer-executable instructions that is/are persistently stored to the memory 34 and executed by the processor 36.

Thus, the system 10 is employed to place a point source (or a line source) in the nuclear imaging examination region with a subject. In one example, the point or line source of radiation is a radioisotope with a different energy than a PET isotope used to generate a PET image of the subject to facilitate discriminating between the imaging isotope and the point or line source. Radiation from the point or line source is detected by the PET detectors, separated from the PET data using energy discrimination algorithms 42 (e.g., stored in memory 34 and executed by the processor 36), and is used to generate the transmission radiation data, particularly a projection through the subject. By using two or more radiation sources, or by rotating the radiation source relative to the patient, a three-dimensional radiation attenuation map is readily generated. The point or line source can be temporarily inserted into the gantry or the nuclear imaging device 20 or a patient support structure, or can be permanently mounted. For example, a receiving structure can be defined at a preselected known location in the patient support or the structure that defines the bore. The known location of the source facilitates analysis of the projection data. Alternatively, the location of the source can be determined by analyzing the projection data.

According to another embodiment, the attenuation map is derived from an anatomic imaging modality such as the MR scanner 12. Multiple point sources 18 may be practically applied for better performance. In the following example, however, the PET/MR combination with a single point source is described. According to the example, an MR image of the object or patient is generated using the MR scanner 12. A body outline and other internal organ boundaries are established. Regions known to be substantially or completely soft-tissue are identified and labeled. Uncharacterizable region(s) such as lung tissue, which includes air, and bone tissue, are left unlabeled.

A nuclear image (e.g., PET or SPECT) of the same object or patient is produced (e.g., nuclear image data is acquired).

Simultaneously, a different energy window is open to accept counts from the radioactive point source 18 properly located outside the boundary of the patient or object but within the examination region in a gantry of the nuclear imager. For instance, a standard energy window is used for SPECT imaging, and an energy window and "singles" mode is used for PET imaging. The point source is at a higher energy than the emission data generated from the radioactive isotope used to image the patient or object (e.g., $^{137}$Cs at 662 keV when imaging PET data at 511 keV). The body outline or contour additionally facilitates differentiating the point source radiation from scatter. Additionally, using a point source with a higher energy than the PET radiation facilitates distinguishing the point source radiation from PET radiation scatter since the point source radiation does not overlap with the lower-energy PET radiation scatter. Data from the source(s) is acquired and accumulated into a histogram or projection that is stored in the memory 34. Attenuation coefficients are assigned (e.g., by the processor when generating the AC map 16) to the known areas of the segmented MR image. A mathematical model is built using the ray tracing algorithm to generate estimated projection data 24 through the MR-based attenuation map 16 with the same geometry as the external point source (see FIG. 2). Unknown regions are assigned air or bone values alternatively until the estimated or simulated mathematical projection data 24 through the attenuation map 16 closely matches the measured transmission data 22 of the point source. The refined AC map 32, properly segmented and with properly assigned values for various ambiguous regions of air and bone tissue, can be used to perform attenuation correction of the nuclear image 23. Once the air and bone regions are determined, the attenuation factors for the various soft tissue regions are, optionally, optimized.

Figure 2:
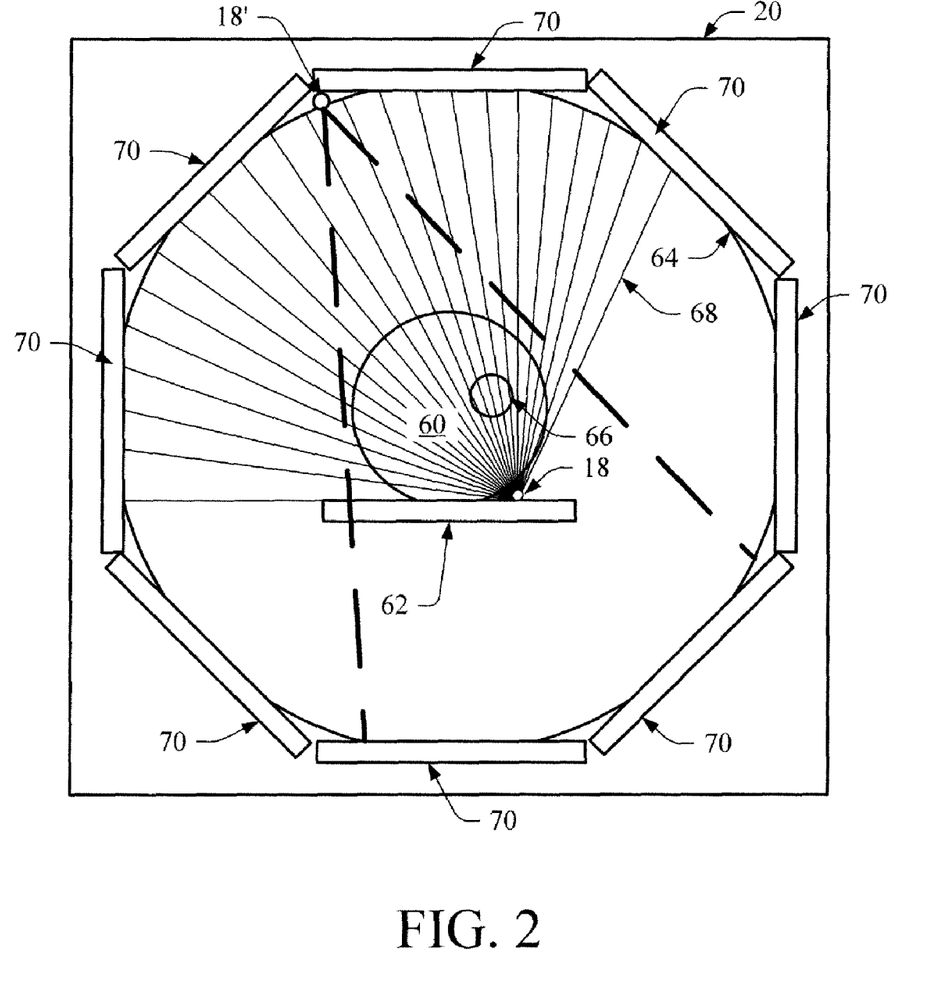
FIG. 2 illustrates the point source position in the nuclear imaging device, in accordance with one or more aspects described herein.

FIG. 2 illustrates the point source 18 positioned in the nuclear imaging device 20, in accordance with one or more aspects described herein. A volume of interest (e.g., an object, patient) 60 is placed on a table or patient support 62 in an imaging region defined by a gantry 64 of the nuclear imaging device 20. The volume of interest has an ambiguous region 66 that may be bone tissue or air (e.g., lung tissue, an air or gas pocket, etc.), which may not be readily disambiguated using an MR image of the volume of interest. Accordingly, the point source 18 is positioned near on the table 62 next to the volume of interest and emits radioactive transmission lines 68 that are detected by nuclear detectors 70 mounted to the gantry 64. In one embodiment, the gantry 64 is a rotatable gantry and the nuclear detectors 70 are rotated about the examination region to detect the transmission lines 68 as well as to acquire nuclear scan data from a radioactive isotope administered into the volume of interest in order to generate a nuclear image thereof.

In another embodiment, two or more point sources 18, 18' having different transmission energies are spaced around the examination region to create a complete field of view. In this manner, two or more line integrals are generated to facilitate resolving ambiguity between bone and air voxels in the MR image data.

In another embodiment, the nuclear detectors 70 are PET detectors and attenuation in acquired PET data is corrected using the herein-described refined AC map when reconstructing a PET image.

In another embodiment, the nuclear detectors 70 are single positron emission computed tomography (SPECT) detectors and attenuation in acquired SPECT data is corrected using the herein-described refined AC map when reconstructing a SPECT image.

Figure 3A:
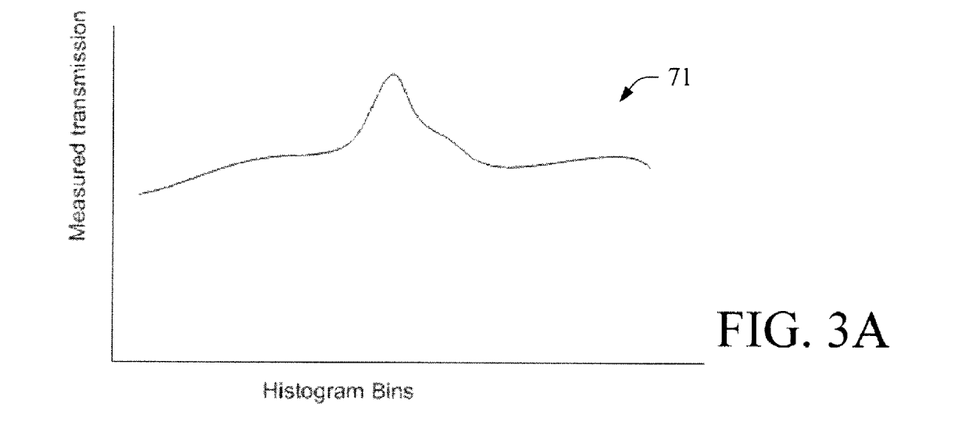
FIG. 3A illustrates a graphical relationship between measured point source transmission data and a plurality of histogram bins into which respective data fall.

FIG. 3A illustrates a graphical relationship 71 between measured point source transmission data 22 and a plurality of histogram bins into which respective data fall. The measured point source transmission data 22 is used in conjunction with the estimated point source transmission data 24 (FIG. 3B) to iteratively refine the AC map until it is ready to be used for PET attenuation correction.

Figure 3B:
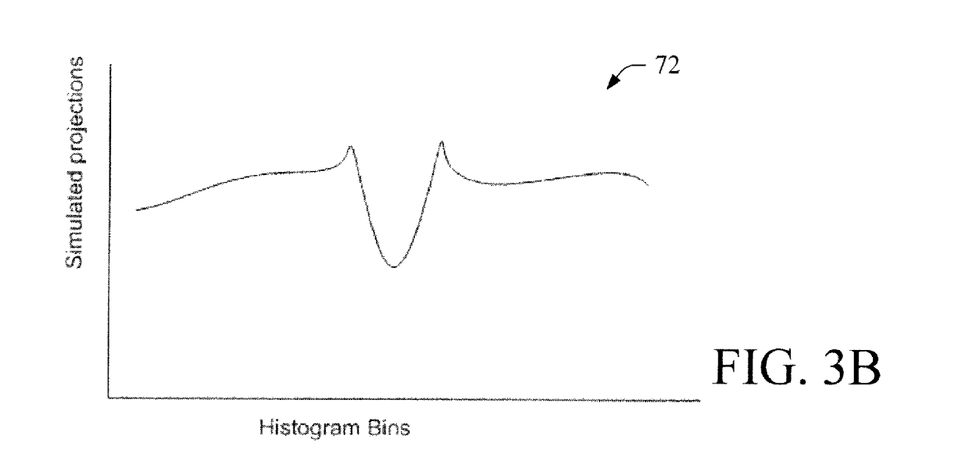
FIG. 3B illustrates a graphical relationship between simulated or estimated point source transmission data generated by the processor using the ray-tracing algorithm(s) and a plurality of histogram bins into which respective simulated data fall.

FIG. 3B illustrates a graphical relationship 72 between simulated or estimated point source transmission data 24 generated by the processor 36 using the ray-tracing algorithm(s) 26 (FIG. 1) and a plurality of histogram bins into which respective simulated data fall. The estimated point source transmission data 24 is compared to the measured point source data 22 and to determine whether the AC map is ready for use in correcting attenuation in the PET scan data when reconstructing a PET image.

Figure 3C:
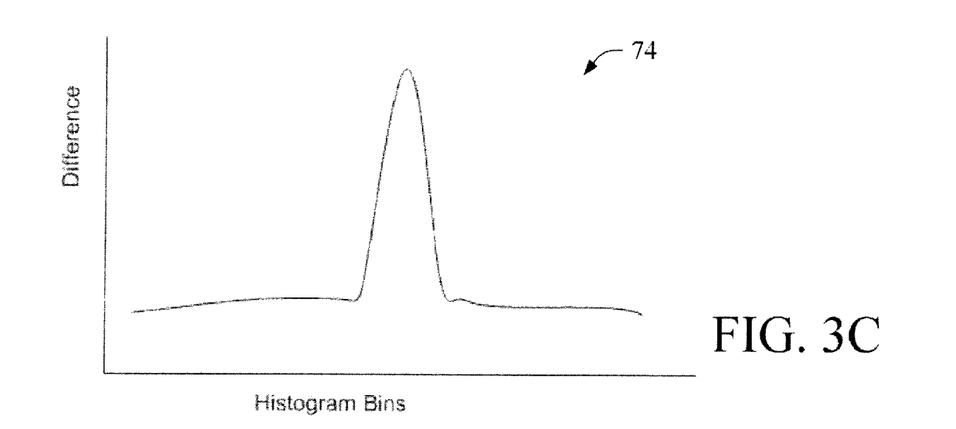
FIG. 3C illustrates a graphical relationship of the difference between measured point source transmission data values and simulated transmission data values and a plurality of histogram bins into which respective difference data fall.

FIG. 3C illustrates a graphical relationship 74 of the difference between measured point source transmission data values and simulated transmission data values and a plurality of histogram bins into which respective difference data fall. The difference values are determined when the processor 36 executes the comparator 28 of FIG. 1. With each iterative adjustment to the AC map, the difference values are reduced. Once the difference values between estimated and measured transmission data are sufficiently small (e.g., below a predetermined threshold), the refined AC map is stored for use in PET attenuation correction.

Figure 4:
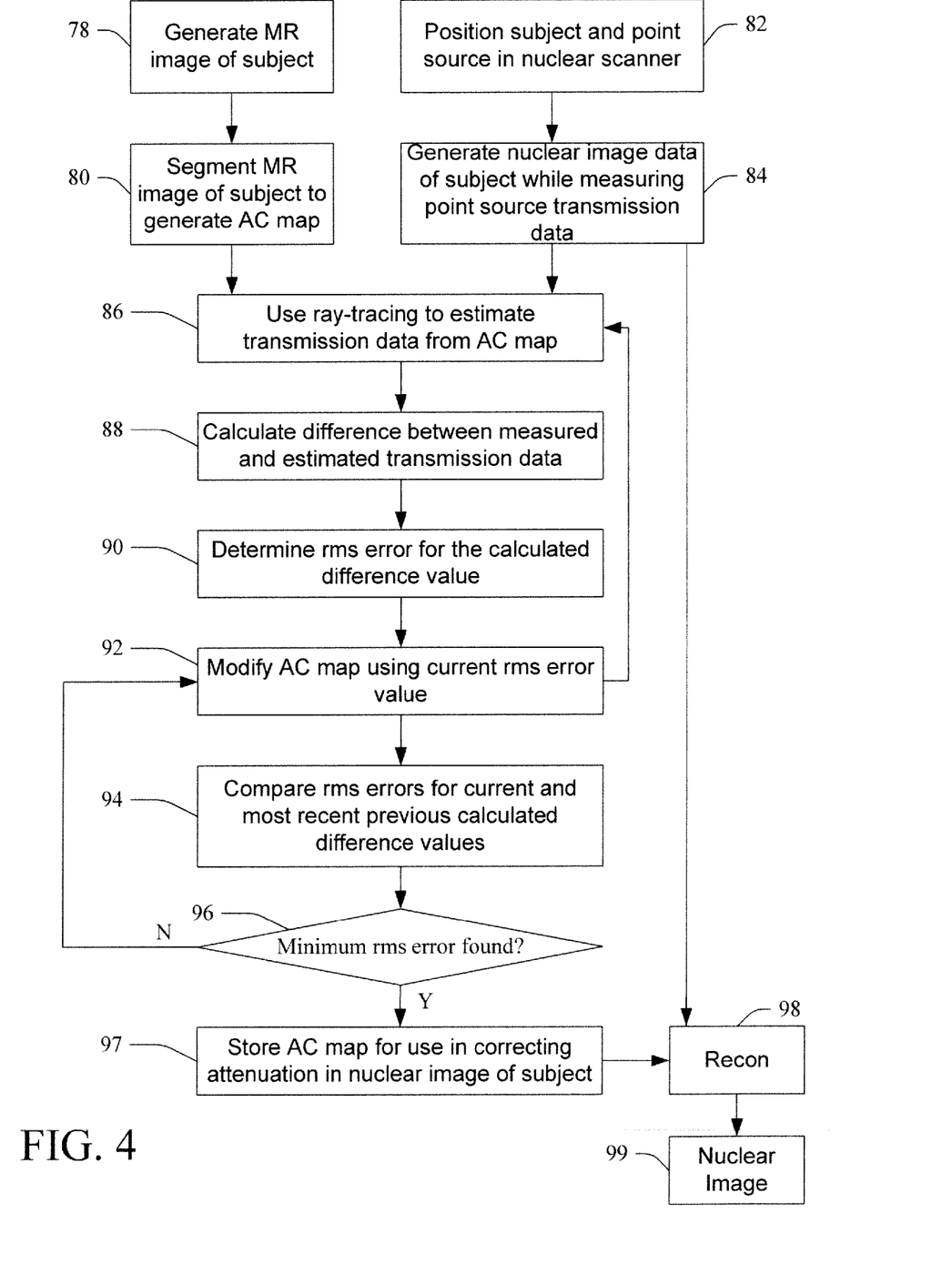
FIG. 4 illustrates a method of generating a refined AC map for correcting attenuation in a nuclear image, in accordance with various aspects described herein.

FIG. 4 illustrates a method of generating a refined AC map for correcting attenuation in a nuclear image, in accordance with various aspects described herein. At 78, an MR image of a subject is generated. At 80, an AC map is generated from the segmented MR image of the subject. At 82, the subject is placed in a nuclear scanner (e.g., PET or SPECT) examination region with a point source positioned outside of the subject and within the examination region. The point source emits gamma rays at a higher energy than a radioactive isotope (e.g., 511 kEV) administered to the subject, such as $^{137}$Cs (e.g., approximately 662 keV). Alternatively, a lower-energy (e.g., lower than 511 keV) is used for the point source, such as $^{133}$Ba (e.g., approximately 360 keV).

At 84, transmission data from the point source is measured using the nuclear scanner, and nuclear image data of the subject is generated. For instance, a PET scanner operating in singles mode can measure point source transmission data at the same time as the nuclear isotope emission data, such as is shown in FIG. 3A. At 86, transmission data is derived or estimated using a ray-tracing technique on the AC map, such as is shown in FIG. 3B. At 88, the difference between the transmission data from 84 and the projection data from 86 is determined, as is shown in FIG. 3C. At 90, an error factor is computed representing the difference determined at 88, such as a root-mean square (rms) error or the like.

At 92, the attenuation map is modified using the factor determined at 90, and the method reverts to 86 for generation of a next projection datum, comparison to measured transmission data, difference determination and rms factor generation. Once two rms error values are obtained, they are compared at 94. At 96, a determination is made regarding whether a minimum rms error has been found. If not, the method reverts to 92. If so, the refined attenuation map is saved, at 97, for use in correcting attenuation in the nuclear image of the subject generated at 84. At 98, the nuclear image data generated at 84 is reconstructed using the AC map stored at 97, to generate an attenuation-corrected nuclear image (e.g., PET or SPECT).

Figure 5:
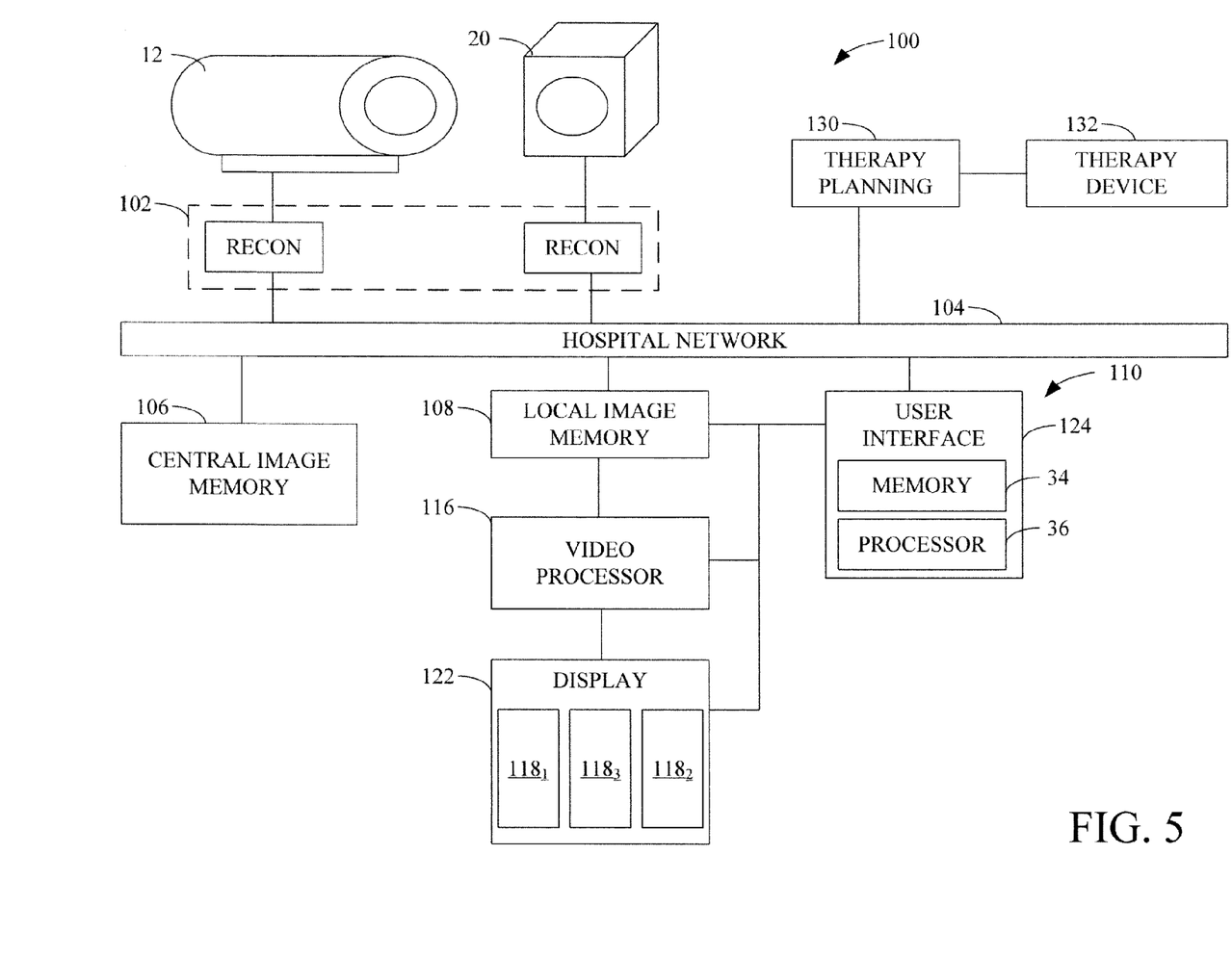
FIG. 5 illustrates an exemplary hospital system that may include a plurality of imaging devices, such as an MR imaging device and a nuclear scanner, which generate imaging data that are reconstructed by individual or shared reconstruction processors to generate 3D image representations.

With reference to FIG. 5, an exemplary hospital system 100 may include a plurality of imaging devices, such as an MR imaging device 12, a nuclear scanner 20 (e.g., PET or SPECT), or the like, which generate imaging data that are reconstructed by individual or shared reconstruction processors 102 to generate 3D image representations. The image representations are communicated over a network 104 to a central memory 106 or a local memory 108.

At a station 110 connected with the network, an operator uses user interface 124 to move a selected 3D patient MR attenuation map to or between the central memory 106 and the local memory 108. A video processor 116 displays the selected attenuation map (or the MR image) in a first viewport 118$_1$, of a display 122. The nuclear image is displayed in a second viewport 118$_2$. A third view port 118$_3$ can display an overlay of the attenuation map and the nuclear image. For example, a user can be permitted to register landmarks in the MR attenuation map to corresponding structures or landmarks in the nuclear image. For instance, the operator, through the interface 124, selects the nuclear image landmarks (e.g., using a mouse, stylus, or other suitable user input device) that correspond to landmarks in the attenuation map image. Alternately, the attenuation map can be aligned automatically by a program in the processor 116. The processor 36 (FIG. 1) in the user interface 124 then performs correction algorithms and infers an appropriate tissue type (e.g., bone or air) to employ when filling in ambiguous areas in the attenuation map.

The refined attenuation map can then be used to reconstruct an attenuation-corrected nuclear image, which may be used in other applications. For instance, a therapy planning station 130 can use the attenuation-corrected PET image to plan a therapy session. Once planned to the satisfaction of the operator, the planned therapy can, where appropriate to an automated procedure, be transferred to a therapy device 132 that implements the planned session. Other stations may use the attenuation-corrected PET image in various other planning processes.

In another embodiment, the overlay displayed in viewport 118$_3$ is adjustable to weight the MR image relative to the nuclear image, or vice versa. For instance a slider bar or knob (not shown), which may be mechanical or presented on the display 122 and manipulated with an input device, may be adjusted to vary the weight of the MR image or the nuclear image. In one example, an operator can adjust the image in viewport 118$_3$ from purely MR image data (shown in viewport 118$_1$), through multiple and/or continuous combinations of MR and nuclear image data, to purely nuclear image data (shown in viewport 118$_2$). For instance, a ratio of MR image data to nuclear image data can be discretely or continuously adjusted from 0:1 to 1:0. As another option, the MR image can be displayed in grayscale and the nuclear image can be colorized. Anatomical landmarks in the MR image help relate the nuclear image to the subject.

The innovation has been described with reference to several embodiments. Modifications and alterations may occur to others upon reading and understanding the preceding detailed description. It is intended that the innovation be construed as including all such modifications and alterations insofar as they come within the scope of the appended claims or the equivalents thereof.

Having thus described the preferred embodiments, the invention is now claimed to be:

1. An anatomical image correction system, including:
    a magnetic resonance (MR) imager that acquires MR image data of a subject during an MR acquisition scan;
    a nuclear scanner that acquires nuclear image data of the subject during a nuclear acquisition scan, and concurrently measures transmission data from a radiation source positioned in an examination region of the nuclear scanner; and
    a processor that:
        generates an attenuation correction (AC) map from the MR image data;
        iteratively refines the AC map to generate a refined AC map using the measured transmission data; and
        corrects the nuclear image data for attenuation using the refined AC map.

2. The system according to claim 1, wherein the processor performs:
    a ray-tracing algorithm on the AC map to generate estimated transmission data;
    a comparison that determines a difference between the estimated transmission data to the measured transmission data; and
    adjustment of attenuation values in the AC map to reduce the difference between the estimated and measured transmission data.

3. The system according to claim 2, wherein the processor calculates a root-mean-square (rms) error values to minimize the difference between the estimated transmission data and the measured transmission data.

4. The system according to claim 2, wherein the processor stores the refined AC map to a memory upon a determination that the difference is minimized.

5. The system according to claim 1, wherein the nuclear scanner is a positron emission tomography (PET) scanner.

6. The system according to claim 5, wherein the PET scanner acquires data from radiation emitted from a radioactive isotope administered to the subject and having an energy level of approximately 511 keV, and wherein the radiation source is a radioactive material having an energy level different from approximately 511 keV.

7. The system according to claim 1, wherein the radiation source is mounted at a fixed location on or in at least one of:
    a patient support on which the subject is positioned in the examination region of a gantry of the nuclear scanner; and
    the gantry.

8. A method of refining a magnetic resonance (MR) attenuation correction (AC) map, including:
    generating an attenuation correction (AC) map from an MR image data of a subject;
    transmitting radiation from a radiation source through a subject, the radiation source being deposed outside the subject;
    measuring transmission data from the radiation transmitted through the subject;
    generating estimated transmission data from the AC map; and
    generating a refined AC map by adjusting the AC map based on a comparison of the measured transmission data and the estimated transmission data.

9. The method according to claim 8, further including:
    generating positron emission tomography (PET) data;
    correcting the PET data with the refined AC map; and
    reconstructing the corrected PET data into a PET image.

10. The method according to claim 9, wherein the PET scanner acquires data from radiation emitted from a radioactive isotope administered to the subject and having an energy level of approximately 511 keV, and wherein the radiation source is a radioactive material having an energy level different from approximately 511 keV.

11. The method according to claim 8, further including:
    determining a first error between the measured transmission data and the estimated transmission data; and
    adjusting the AC map to reduce the error.

12. The method according to claim 11, further including:
    determining second estimated transmission data using the adjusted AC map;

determining a second error between the measured transmission data and the second estimated transmission data; and further adjusting the AC map to further reduce the error.

13. The method according to claim 12, wherein determining the error includes:

iteratively determining root-mean-square (rms) values and adjusting the AC map until the determined rms values are optimized.

14. A non-transitory computer-readable medium having stored thereon software for controlling one or more computers to perform the method according to claim 13.

15. A positron emission tomography (PET) scanner including:

a ring of radiation detectors;

a radiation source stationarily mounted within the ring of radiation detectors;

a processor programmed to perform the method according to claim 8 to generate a refined attenuation correction (AC) map;

a reconstruction algorithm that corrects PET data from the radiation detectors with the refined AC map and reconstructs the corrected PET data into an attenuation-corrected PET image.

16. A single-photon emission computed tomography (SPECT) scanner including:

a plurality of radiation detectors;

a radiation source stationarily mounted within an examination region of radiation detectors;

a processor programmed to perform the method according to claim 8 to generate a refined attenuation correction (AC) map;

a reconstruction algorithm that corrects SPECT data from the radiation detectors with the refined AC map and reconstructs the corrected SPECT data into an attenuation-corrected SPECT image.

17. An apparatus for refining an attenuation correction map for correcting attenuation in a nuclear image, including:

means for generating an attenuation correction (AC) map from an MR image of a subject;

means for transmitting radiation through a subject, the means for transmitting radiation being deposed outside the subject;

means for measuring transmission data from the radiation transmitted through the subject;

means for generating estimated transmission data from the AC map; and means for generating a refined AC map by adjusting the AC map based on a comparison of the measured transmission data and the estimated transmission data.

18. A method of refining an attenuation correction (AC) map, including:

generating the AC map from acquired magnetic resonance (MR) image data;

differentiating between bone and air voxels in the MR image data using transmission data detected from a radioactive point source; and updating the AC map based on the detected point source transmission data.

* * * * *